US011824034B2

United States Patent
Jang

(10) Patent No.: US 11,824,034 B2
(45) Date of Patent: Nov. 21, 2023

(54) DISPLAY DEVICE INCLUDING ADHESIVE FILM WITH CONDUCTIVE BALL

(71) Applicant: Samsung Display Co., Ltd., Yongin-Si (KR)

(72) Inventor: Joo-Nyung Jang, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 48 days.

(21) Appl. No.: 17/109,382

(22) Filed: Dec. 2, 2020

(65) Prior Publication Data

US 2021/0288015 A1     Sep. 16, 2021

(30) Foreign Application Priority Data

Mar. 10, 2020    (KR) .......................... 10-2020-0029705

(51) Int. Cl.
    *H01L 23/00*         (2006.01)
    *H05K 1/11*          (2006.01)
    (Continued)

(52) U.S. Cl.
    CPC .............. *H01L 24/32* (2013.01); *H01L 24/05* (2013.01); *H01L 24/06* (2013.01); *H01L 24/29* (2013.01);
    (Continued)

(58) Field of Classification Search
    CPC ......... H01L 24/32; H01L 24/05; H01L 24/06; H01L 24/29; H01L 27/3276;
    (Continued)

(56) References Cited

U.S. PATENT DOCUMENTS 5,502,891 A * 4/1996 Mori ...................... H05K 3/361
                                                 174/117 FF
5,592,365 A * 1/1997 Sugimoto .............. H05K 3/323
                                                    361/779

(Continued)

FOREIGN PATENT DOCUMENTS

JP          H11148058 A   *   6/1999
JP          2015232660 A   *   12/2015
(Continued)

OTHER PUBLICATIONS

Sang-Hoon Lee et al., "Nanofiber Anisotropic Conductive Films (ACF) for Ultra-Fine-Pitch Chip-on-Glass (COG) Interconnections," Journal of Electronic Materials, 2015, pp. 4628-4636, vol. 44, No. 11.

*Primary Examiner* — Nduka E Ojeh
*Assistant Examiner* — Laura M Dykes
(74) *Attorney, Agent, or Firm* — CANTOR COLBURN LLP

(57) ABSTRACT

A display device includes a display panel including a first signal pad and a second signal pad, a circuit board overlapped with the first and second signal pads, and an adhesive film overlapped with the first and second signal pads and disposed between the circuit board and the display panel. The adhesive film includes a base resin and a plurality of conductive balls dispersed in the base resin. The circuit board includes a first driving pad and a second driving pad. The first and second driving pads protrude toward the adhesive film and are arranged in a first direction. The first and second driving pads overlap with the first and second (Continued)

signal pads, respectively. The display device may be configured to satisfy the inequality:

$$T \geq G + \frac{B \times S}{W + S}.$$

19 Claims, 10 Drawing Sheets

(51) Int. Cl.
 *H05K 1/18* (2006.01)
 *H10K 59/131* (2023.01)
(52) U.S. Cl.
 CPC ............ *H05K 1/118* (2013.01); *H05K 1/189* (2013.01); *H10K 59/131* (2023.02); *H01L 2224/04026* (2013.01); *H01L 2224/05541* (2013.01); *H01L 2224/05573* (2013.01); *H01L 2224/06135* (2013.01); *H01L 2224/29499* (2013.01); *H01L 2224/32013* (2013.01); *H01L 2224/32148* (2013.01); *H01L 2224/32227* (2013.01); *H01L 2224/32238* (2013.01); *H05K 2201/10128* (2013.01)
(58) Field of Classification Search
 CPC . H01L 2224/04026; H01L 2224/05541; H01L 2224/05573; H01L 2224/06135; H01L 2224/29499; H01L 2224/32013; H01L 2224/32148; H01L 2224/32227; H01L 2224/32238; H05K 1/118; H05K 1/189; H05K 2201/10128
 USPC ......................................................... 257/738
 See application file for complete search history.

(56) References Cited

U.S. PATENT DOCUMENTS

| | | | |
|---|---|---|---|
| 10,546,831 | B2 | 1/2020 | Shinohara |
| 2007/0068622 | A1* | 3/2007 | Konishi ................. H05K 3/323 |
| | | | 257/E21.511 |
| 2013/0120948 | A1* | 5/2013 | Sato ......................... H05K 1/11 |
| | | | 438/119 |
| 2017/0309646 | A1* | 10/2017 | Son ..................... G06F 3/03547 |
| 2017/0338198 | A1 | 11/2017 | Jang et al. |
| 2019/0256675 | A1 | 8/2019 | Miyake et al. |
| 2020/0152351 | A1 | 5/2020 | Tsukao |
| 2020/0403054 | A1 | 12/2020 | Jang |

FOREIGN PATENT DOCUMENTS

| | | | |
|---|---|---|---|
| JP | 6221285 | B2 | 11/2017 |
| JP | 2019133942 | A | 8/2019 |
| KR | 20140043305 | A * | 4/2014 |
| KR | 1020170130003 | A | 11/2017 |
| KR | 1020190057090 | A | 5/2019 |
| KR | 1020190064644 | A | 6/2019 |
| KR | 102042400 | B1 | 11/2019 |
| KR | 1020200145985 | A | 12/2020 |

* cited by examiner

DISPLAY DEVICE INCLUDING ADHESIVE FILM WITH CONDUCTIVE BALL

This application claims priority to Korean Patent Application No. 10-2020-0029705, filed on Mar. 10, 2020, in the Korean Intellectual Property Office, and all the benefits accruing therefrom under 35 U.S.C. § 119, the content of which in its entirety is herein incorporated by reference.

BACKGROUND OF THE INVENTION

The present disclosure relates to a display device, and in particular, to an adhesive film and a display device including the same.

Various display devices are being developed for use in multimedia devices, such as televisions, mobile phones, tablet computers, navigation systems, and gaming machines.

The display device includes a display panel displaying an image. The display panel includes a plurality of gate lines, a plurality of data lines, and a plurality of pixels connected to the gate and data lines. The display panel is connected to an electronic component providing electrical signals, which are used to display an image, to the gate or data lines.

The electronic component is mounted on the display panel using an anisotropic conductive film or by an ultrasonography method.

SUMMARY

An embodiment of the inventive concept provides a display device with improved reliability.

According to an embodiment of the inventive concept, a display device includes a display panel including a display region and a non-display region and including a first signal pad and a second signal pad, where the first and second signal pads are arranged in a first direction in the non-display region, a circuit board disposed on the display panel and overlapped with the first and second signal pads in a thickness direction, and an adhesive film disposed between the circuit board and the display panel and overlapped with the first and second signal pads. The adhesive film includes a base resin and a plurality of conductive balls dispersed in the base resin. The circuit board includes a first driving pad and a second driving pad. The first and second driving pads protrude toward the adhesive film and are arranged in the first direction. The first driving pad and the second driving pad overlap with the first signal pad and the second signal pad, respectively. The display device satisfies the following formula 1:

$$T \geq G + \frac{B \times S}{W + S}, \quad \text{[Formula 1]}$$

where B is a thickness of the first driving pad in the thickness direction, T is a thickness of the adhesive film before bonding the circuit board to the display panel, G is a distance between the first signal pad and the first driving pad, S is a distance between the first driving pad and the second driving pad, and W is a width of the first driving pad in the first direction.

In an embodiment, the base resin may be disposed between the first driving pad and the second driving pad.

In an embodiment, the adhesive film may include a first region overlapped with the first driving pad, a second region overlapped with the second driving pad, and a third region defined as a region between the first region and the second region. The plurality of conductive balls may include a first conductive ball disposed in the first region, a second conductive ball disposed in the second region, and a third conductive ball disposed in the third region. The first to third conductive balls may have the same volume.

In an embodiment, a diameter of the third conductive ball in the thickness direction may be 0.5 to 1.0 times the thickness T.

In an embodiment, the display panel may be parallel to a plane defined by the first direction and a second direction crossing the first direction. Each of lengths of the first and second conductive balls in a third direction perpendicular to the plane may be equal to the distance G, and the third direction may be the thickness direction.

In an embodiment, a diameter of the third conductive ball in the thickness direction may be greater than the distance G.

In an embodiment, the thickness B may be smaller than a diameter of the third conductive ball in the thickness direction.

In an embodiment, the first conductive ball may be in direct contact with both of the first signal pad and the first driving pad. The second conductive ball may be in direct contact with both of the second signal pad and the second driving pad.

In an embodiment, a change in diameter of the plurality of conductive balls may be defined as (a diameter of the third conductive ball in the thickness direction−a diameter of the first conductive ball in the thickness direction)/the diameter of the third conductive ball×100 (percentages: %). The change in diameter of the plurality of conductive balls may be less than or equal to about 25%.

In an embodiment, the plurality of conductive balls may be arranged in the first direction.

In an embodiment, the display panel may include a first pixel and a second pixel, which overlap with the display region. Each of the first and second signal pads may transmit an electrical signal to each of the first and second pixels.

In an embodiment, the circuit board may be a driving chip.

In an embodiment, the circuit board may be a flexible circuit board.

In an embodiment, the first signal pad and the second signal pad may have the same shape, and the first driving pad and the second driving pad may have the same shape.

In an embodiment, the base resin may include a heat-curing resin or a photo-curing resin.

In an embodiment, the plurality of conductive balls may include at least one of metals, metal oxides, or metal nitrides.

In an embodiment, the plurality of conductive balls may be arranged to form a single layer.

According to an embodiment of the inventive concept, a display device includes a display panel including a display region and a non-display region and including a first signal pad and a second signal pad, where the first and second signal pads are arranged in a first direction in the non-display region, a circuit board disposed on the display panel and overlapped with the first and second signal pads in a thickness direction, and an adhesive film disposed between the circuit board and the display panel and overlapped with the first and second signal pads. The adhesive film includes a base resin and a plurality of conductive balls dispersed in the base resin. The circuit board includes a first driving pad and a second driving pad. The first and second driving pads protrude toward the adhesive film and are arranged in the first direction. The first driving pad and the second driving pad overlap with the first signal pad and the second signal pad, respectively. The adhesive film includes a first region overlapped with the first driving pad, a second region overlapped with the second driving pad, and a third region defined between the first region and the second region. A diameter difference between a conductive ball of the plurality of conductive balls in the first region and a conductive ball of the plurality of conductive balls in the third region is less than or equal to about 25%. The base resin is disposed between the first driving pad and the second driving pad.

In an embodiment, the plurality of conductive balls may be arranged to form a single layer.

In an embodiment, each of the plurality of conductive balls disposed in the first region may be in direct contact with each of the first signal pad and the first driving pad.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
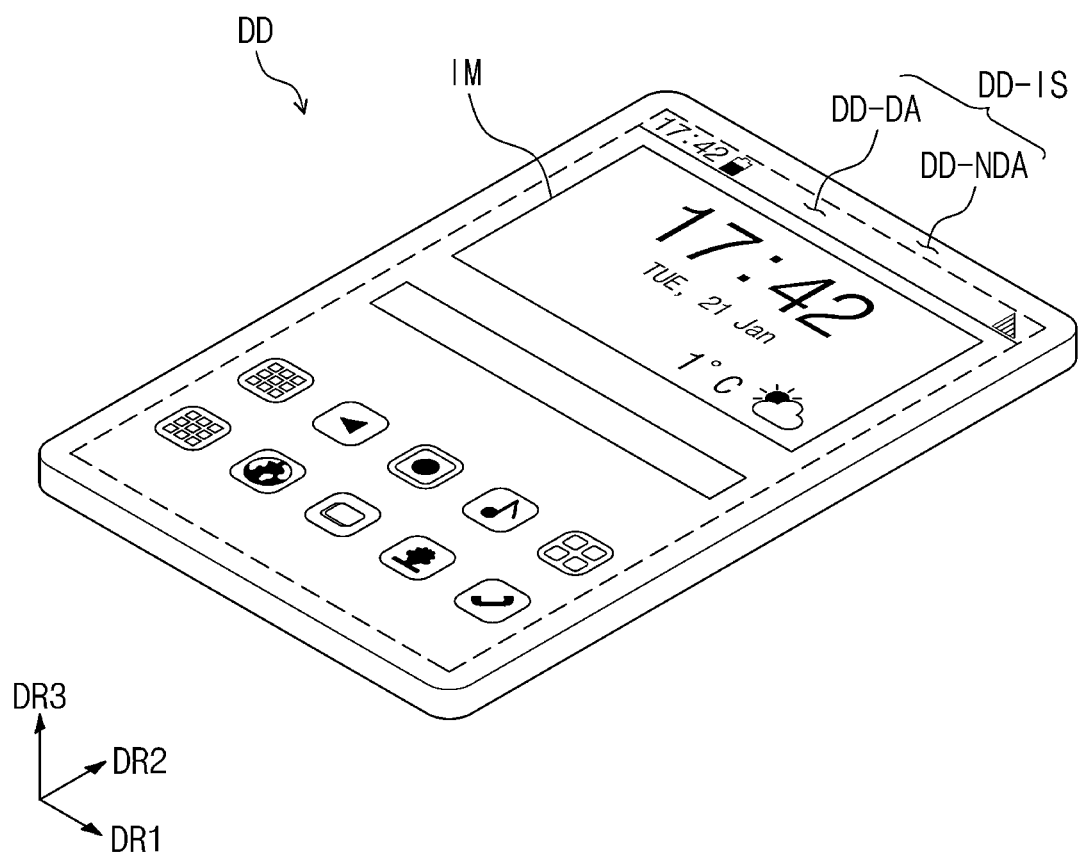
FIG. 1A is a perspective view illustrating a display device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
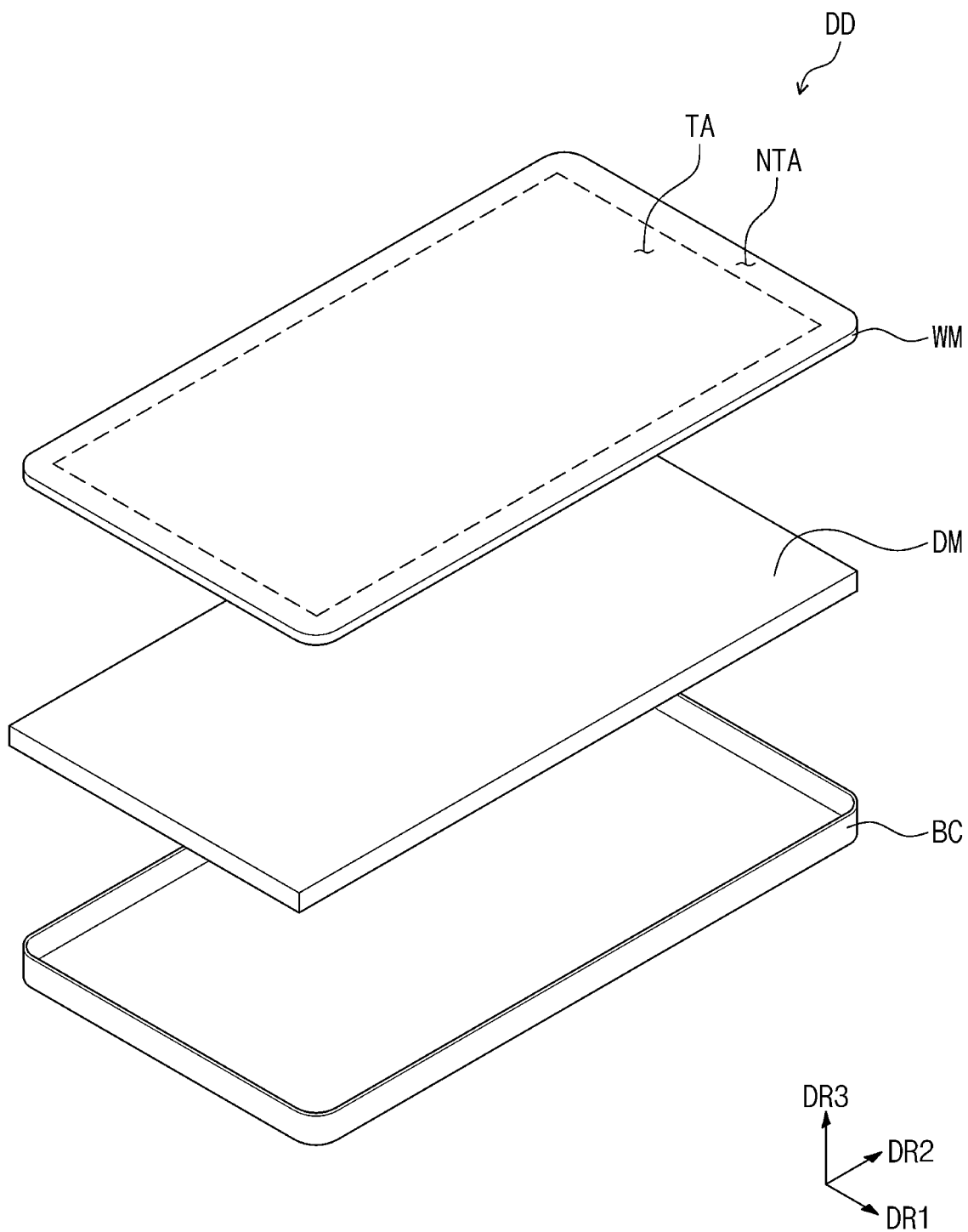
FIG. 1B is an exploded perspective view illustrating a display device according to an embodiment of the inventive concept.
Figure 2:
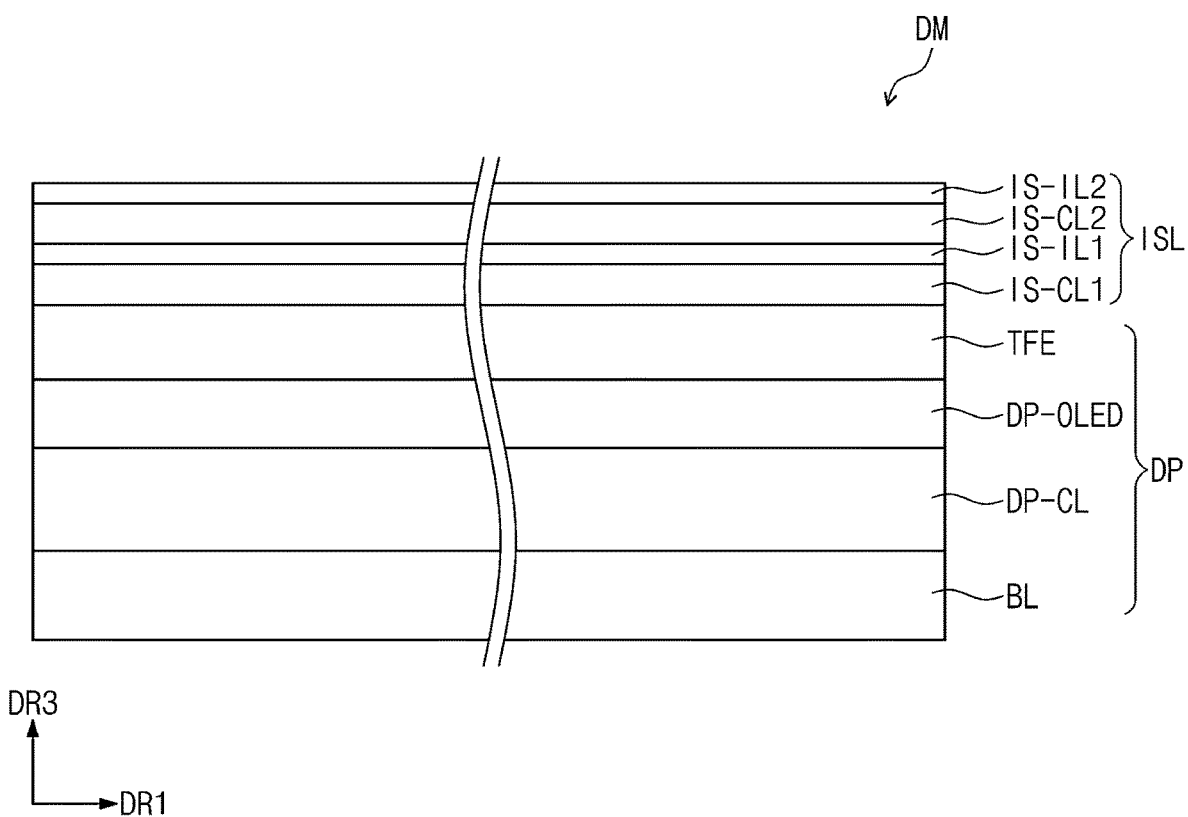
FIG. 2 is a cross-sectional view illustrating a display module according to an embodiment of the inventive concept.
Figure 3:
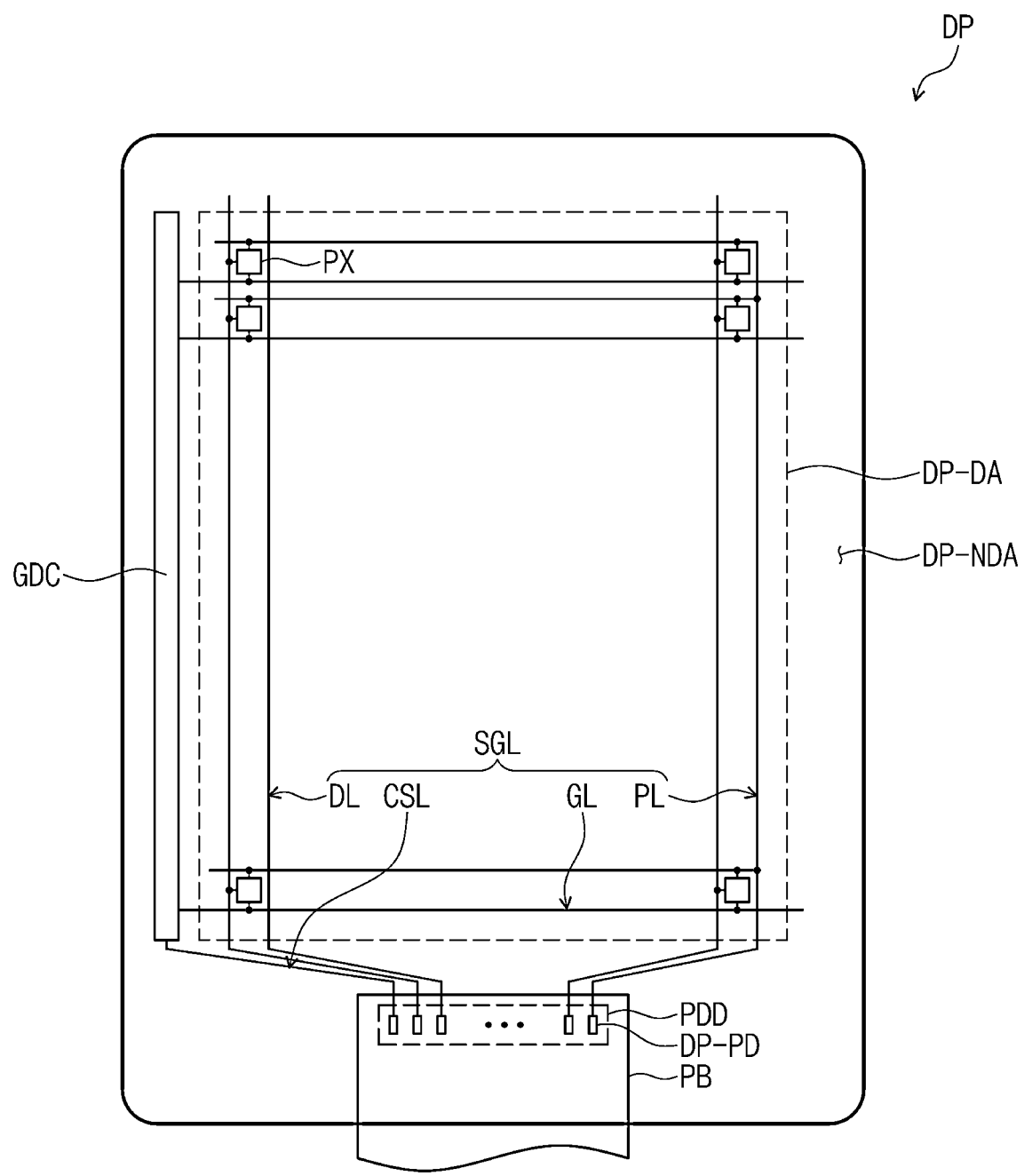
FIG. 3 is a plan view illustrating a display panel according to an embodiment of the inventive concept.

FIG. 1A is a perspective view illustrating a display device DD according to an embodiment of the inventive concept. FIG. 1B is an exploded perspective view illustrating the display device DD according to an embodiment of the inventive concept. FIG. 2 is a cross-sectional view illustrating a display module DM according to an embodiment of the inventive concept. FIG. 3 is a plan view illustrating a display panel DP according to an embodiment of the inventive concept.

In the present specification, the display device DD, which can be used for a cellphone terminal, is exemplarily illustrated. Although not shown, the cellphone terminal may further include an electronic module, a camera module, a power module, and so forth, which are mounted on a mainboard and are provided in a bracket or case, along with the display device DD. The display device DD may be used for large-sized electronic devices (e.g., television sets and monitors) or small- or medium-sized electronic devices (e.g., tablets, car navigation systems, gaming machines, and smart watches).

Referring to FIG. 1A, the display device DD may include a display surface DD-IS, which is used to display an image IM. As an example of the image IM, icon images are shown in FIG. 1A. The display surface DD-IS may be parallel to a plane defined by a first direction DR1 and a second direction DR2. A normal direction of the display surface DD-IS (i.e., a thickness direction of the display device DD) will be referred to as a third direction DR3. In the present specification, the expression "when viewed in a plan view" or "in a plan view" may be used to describe a shape of an object viewed in the third direction DR3. Hereinafter, the third direction DR3 may be used to differentiate a front or top surface of each layer or unit from a back or bottom surface. However, directions indicated by the first to third directions DR1, DR2, and DR3 may be relative concept, and in an embodiment, they may be changed to other (e.g., opposite) directions.

In addition, the display surface DD-IS may include a display region DD-DA, which is used to display the image IM, and a non-display region DD-NDA, which is disposed near the display region DD-DA. The non-display region DD-NDA may not be used to display an image. However, the inventive concept is not limited to this example, and in another embodiment, the non-display region DD-NDA may be disposed near at least one of edges of the display region DD-DA or may be omitted.

Referring to FIG. 1B, the display device DD may include a window WM, the display module DM, and a housing BC. The housing BC may contain the display module DM and may be coupled to the window WM.

The window WM may be disposed on the display module DM and may transmit an image, which is provided from the display module DM, to the outside. The window WM may include a transmission region TA and a non-transmission region NTA. The transmission region TA may overlap with the display region DD-DA of the display surface DD-IS and may have a shape corresponding to the display region DD-DA. The image IM, which is displayed on the display region DD-DA of the display device DD, may be provided to a user through the transmission region TA of the window WM.

The non-transmission region NTA may overlap with the non-display region DD-NDA and may have a shape corresponding to the non-display region DD-NDA. The non-transmission region NTA may have relatively low optical transmittance, compared with the transmission region TA. However, the inventive concept is not limited to this example, and in an embodiment, the non-transmission region NTA may be omitted.

The window WM may be formed of or include, for example, glass, sapphire, plastic, or the like. Although the window WM is illustrated to have a single-layered structure, the window WM may include a plurality of layers in another embodiment. The window WM may include a base layer and at least one printing layer. The at least one printing layer is disposed on a rear surface of the base layer and overlaps with the non-transmission region NTA. The printing layer may have a specific color. As an example, the printing layer may have a black color or another color.

The display module DM may be disposed between the window WM and the housing BC.

Referring to FIG. 2, the display module DM may include the display panel DP and an input-sensing layer ISL. The display panel DP may generate an image and transmit the generated image to the window WM.

In an embodiment, the display panel DP may be a light-emitting type display panel, but the inventive concept is not limited to a specific type of the display panel DP. For example, the display panel DP may be an organic light-emitting display panel or a quantum dot light-emitting display panel. An emission layer of the organic light-emitting display panel may be formed of or include an organic luminescent material. An emission layer of the quantum dot light-emitting display panel may include a quantum dot, a quantum rod, or the like. For the sake of simplicity, the description that follows will refer to an example in which the display panel DP is the organic light-emitting display panel.

Hereinafter, an example, in which the display panel DP is the organic light-emitting display panel, will be described. However, the inventive concept is not limited to this example, and various display panels may be used to realize the inventive concept.

The display panel DP may include a base layer BL and a circuit device layer DP-CL, a display device layer DP-OLED, and a thin encapsulation layer TFE, which are disposed on the base layer BL. Although not shown, the display panel DP may further include functional layers such as a refractive index controlling layer.

The base layer BL may include a synthetic resin substrate or a glass substrate. In addition, the base layer BL may include a metal substrate or a substrate, which is formed of an organic/inorganic composite material.

The circuit device layer DP-CL may include at least one intermediate insulating layer and a circuit device. The intermediate insulating layer may include at least one intermediate inorganic layer and/or at least one intermediate organic layer. The circuit device may include signal lines, pixel driving circuits, and so forth.

The display device layer DP-OLED may include a plurality of organic light-emitting diodes. The display device layer DP-OLED may further include an organic layer, such as a pixel definition layer. Alternatively, the display panel may be a liquid crystal display panel, and in this case, the display device layer may include a liquid crystal layer.

The thin encapsulation layer TFE may seal or encapsulate the display device layer DP-OLED. The thin encapsulation layer TFE may include at least one insulating layer. In an embodiment, the thin encapsulation layer TFE may include at least one inorganic layer (hereinafter, an inorganic encapsulation layer). In an embodiment, the thin encapsulation layer TFE may include at least one organic layer (hereinafter, an organic encapsulation layer) and at least one inorganic encapsulation layer.

The input-sensing layer ISL may be disposed between the window WM and the display panel DP. The input-sensing layer ISL may sense an input provided from the outside. The external input may be provided in various forms. For example, the external input may include various types of external inputs, such as a part (e.g., a hand or a finger) of a user's body, a stylus pen, light, heat, or pressure. The external input may be a non-touching-type event (e.g., a hovering event near the sensing unit), in addition to such a touching-type event caused by the user's hand.

The input-sensing layer ISL may be directly disposed on the display panel DP. In the present specification, the expression "an element A may be directly disposed on an element B" means that an adhesive layer is not disposed between the elements A and B. In the present embodiment, the input-sensing layer ISL and the display panel DP may be fabricated through a consecutive process. However, the inventive concept is not limited to this example, and in another embodiment, the input-sensing layer ISL may be provided in the form of an individual panel and may be connected to the display panel DP using an adhesive layer. In certain embodiments, the input-sensing layer ISL may be omitted.

The input-sensing layer ISL may include a first conductive layer IS-CL1, a first insulating layer IS-IL1, a second conductive layer IS-CL2, and a second insulating layer IS-IL2. An insulating layer may be further disposed below the first conductive layer IS-CL1.

Each of the first and second conductive layers IS-CL1 and IS-CL2 may include a metal layer or a transparent conductive layer. The metal layer may be formed of or include at least one of molybdenum, silver, titanium, copper, aluminum, or alloys thereof. The transparent conductive layer may include a transparent conductive oxide, such as indium tin oxide ("ITO"), indium zinc oxide ("IZO"), zinc oxide ("ZnO"), or indium tin zinc oxide ("ITZO"). In an embodiment, the transparent conductive layer may include a conductive polymer (e.g., PEDOT), metal nanowires, or graphene.

Each of the first and second insulating layers IS-IL1 and IS-IL2 may include an inorganic material, an organic matter, or a composite material. The inorganic material may include, for example, aluminum oxide, titanium oxide, silicon oxide, silicon oxynitride, or the like.

The organic material may be formed of or include at least one of acrylic resins, methacryl resins, polyisoprene resins, vinyl resins, epoxy resins, urethane resins, cellulose resins, siloxane resins, polyimide resins, polyamide resins, or perylene resins.

Referring to FIG. 3, the display panel DP may include a display region DP-DA and a non-display region DP-NDA. The display region DP-DA of the display panel DP may correspond to the display region DD-DA of the display surface DD-IS shown in FIG. 1A or the transmission region TA of the window WM shown in FIG. 1B, and the non-display region DP-NDA may correspond to the non-display region DD-NDA of the display surface DD-IS shown in FIG. 1A or the non-transmission region NTA of the window WM shown in FIG. 1B.

The display panel DP may include a driving circuit GDC, a plurality of signal lines SGL, a plurality of signal pads DP-PD, and a plurality of pixels PX. The pixels PX may be disposed in the display region DP-DA. Each of the pixels PX may include an organic light-emitting diode and a pixel driving circuit connected thereto. The driving circuit GDC, the signal lines SGL, the signal pads DP-PD, and the pixel driving circuit may be included in the circuit device layer DP-CL of the display panel shown in FIG. 2.

The driving circuit GDC may sequentially output gate signals to the gate lines GL. In an embodiment, the driving circuit GDC may output other control signals to the pixels PX. The driving circuit GDC may include a plurality of thin-film transistors that are formed by the same process as that for the driving circuit of the pixels PX (e.g., by a low temperature polycrystalline silicon ("LTPS") process or a low temperature polycrystalline oxide ("LTPO") process).

The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit.

The signal lines SGL may overlap with the display region DP-DA and the non-display region DP-NDA. Each of the signal lines SGL may include a pad portion and a line portion. The line portion may overlap with the display region DP-DA and the non-display region DP-NDA.

The signal pads DP-PD may be connected to an end of the signal lines SGL. A portion of the non-display region DP-NDA, in which the signal pads DP-PD are disposed, may be defined as a pad portion PDD.

A circuit board PB may also be disposed on the display panel DP, as shown in FIG. 3. The circuit board PB may be disposed on the pad portion PDD to overlap with the non-display region DP-NDA (See FIG. 5). In detail, the circuit board PB may be disposed to overlap with the pad portion PDD.

In an embodiment, the circuit board PB may be a flexible circuit board or a driving chip. The circuit board PB may be used to deliver electrical signals to the circuit device layer DP-CL of the display panel DP. For example, the electrical signals may be signals, which are provided from the outside or are generated in the circuit board PB. The electrical signals may include driving signals, which are used to operate the display panel DP.

The circuit board PB may be electrically connected to the display module DM. FIG. 3 illustrates an example, in which the circuit board PB is connected to the display panel DP, but in another embodiment, the circuit board PB may be electrically connected to the input-sensing layer ISL.

In an embodiment, the circuit board PB may be electrically connected to the display module DM through an adhesive film. The adhesive film may be an anisotropic conductive film ("ACF").

Figure 4:
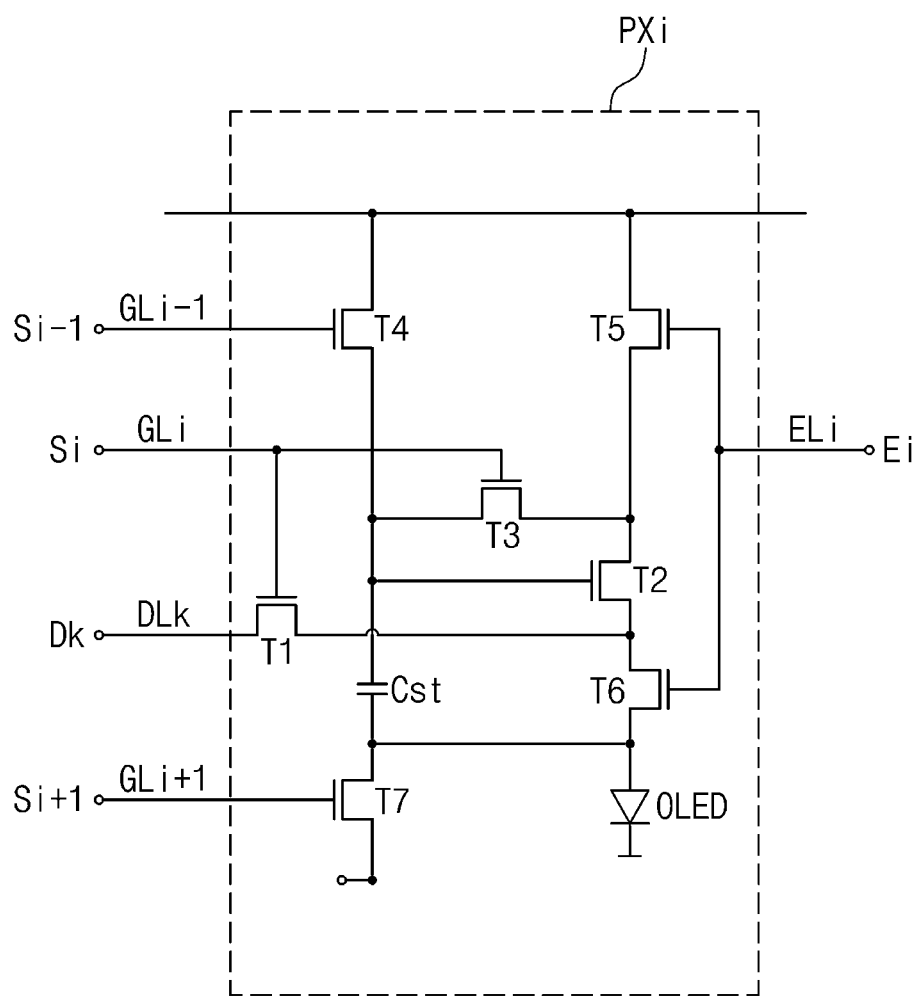
FIG. 4 is an equivalent circuit diagram of a pixel shown in FIG. 3.

FIG. 4 is an equivalent circuit diagram of the pixel PX of FIG. 3. FIG. 4 exemplarily illustrates an i-th pixel PXi connected to a k-th data line DLk, which is one of a plurality of data lines DL1 to DLm. The i-th pixel PXi may be activated in response to an i-th scan signal Si, which is applied to an i-th scan line GLi.

The i-th pixel PXi may include a pixel driving circuit controlling a light-emitting device OLED. In an embodiment, the pixel driving circuit may include seven thin-film transistors T1 to T7 and one capacitor Cst. However, the pixel driving circuit including seven thin-film transistors T1 to T7 and one capacitor Cst is exemplarily illustrated, and the structure of the pixel driving circuit may be variously changed.

The thin-film transistors T1 to T7 may include a driving transistor controlling a driving current to be supplied to the light-emitting device OLED. An output electrode of a second transistor T2 may be electrically connected to the light-emitting device OLED. The output electrode of the second transistor T2 may be electrically connected to the light-emitting device OLED through a sixth transistor T6.

The sixth transistor T6 may be disposed between and coupled to an output electrode of a first transistor T1 and a first electrode (i.e., an anode) of the light-emitting device OLED. A control electrode of the sixth transistor T6 may be coupled to an i-th emission control line Eli to receive an emission control signal Ei.

The thin-film transistors T1 to T7 may include a control transistor having a control electrode, to which a control signal is provided. The control signal, which is applied to the i-th pixel PXi, may include an (i−1)-th scan signal Si−1, the i-th scan signal Si, an (i+1)-th scan signal Si+1, a data signal Dk, and an i-th emission control signal Ei. In an embodiment, the control transistor may include the first transistor T1 and third to seventh transistors T3-T7.

The first transistor T1 may include a sensing electrode coupled to a k-th data line DLk, a control electrode coupled to an i-th scan line GLi, and an output electrode coupled to the output electrode of the second transistor T2. The first transistor T1 may be turned on by the scan signal Si (hereinafter, the i-th scan signal), which is applied to the i-th scan line GLi, and in this case, the data signal Dk applied to the k-th data line DLk may be provided to the storage capacitor Cst through the first transistor T1.

Figure 5:
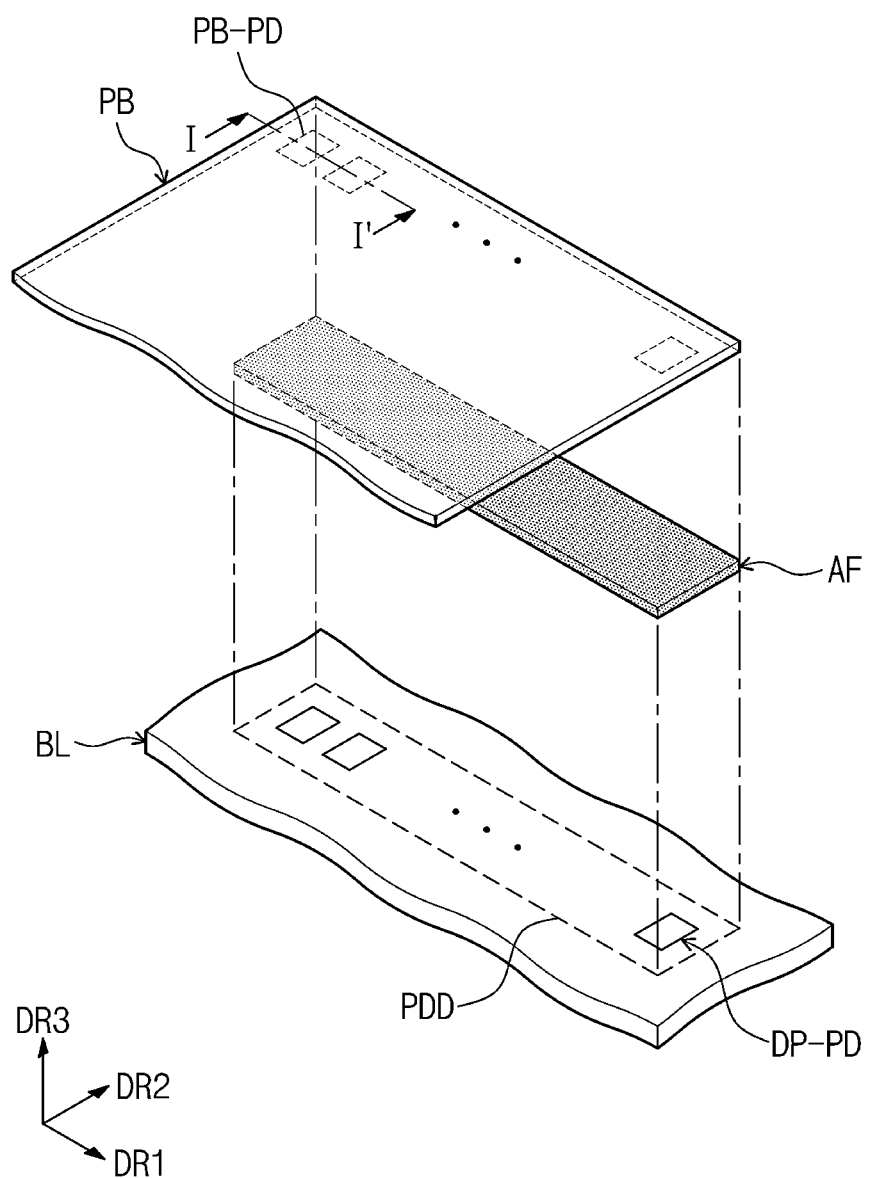
FIG. 5 is an exploded perspective view illustrating a display device according to an embodiment of the inventive concept.
Figure 6:
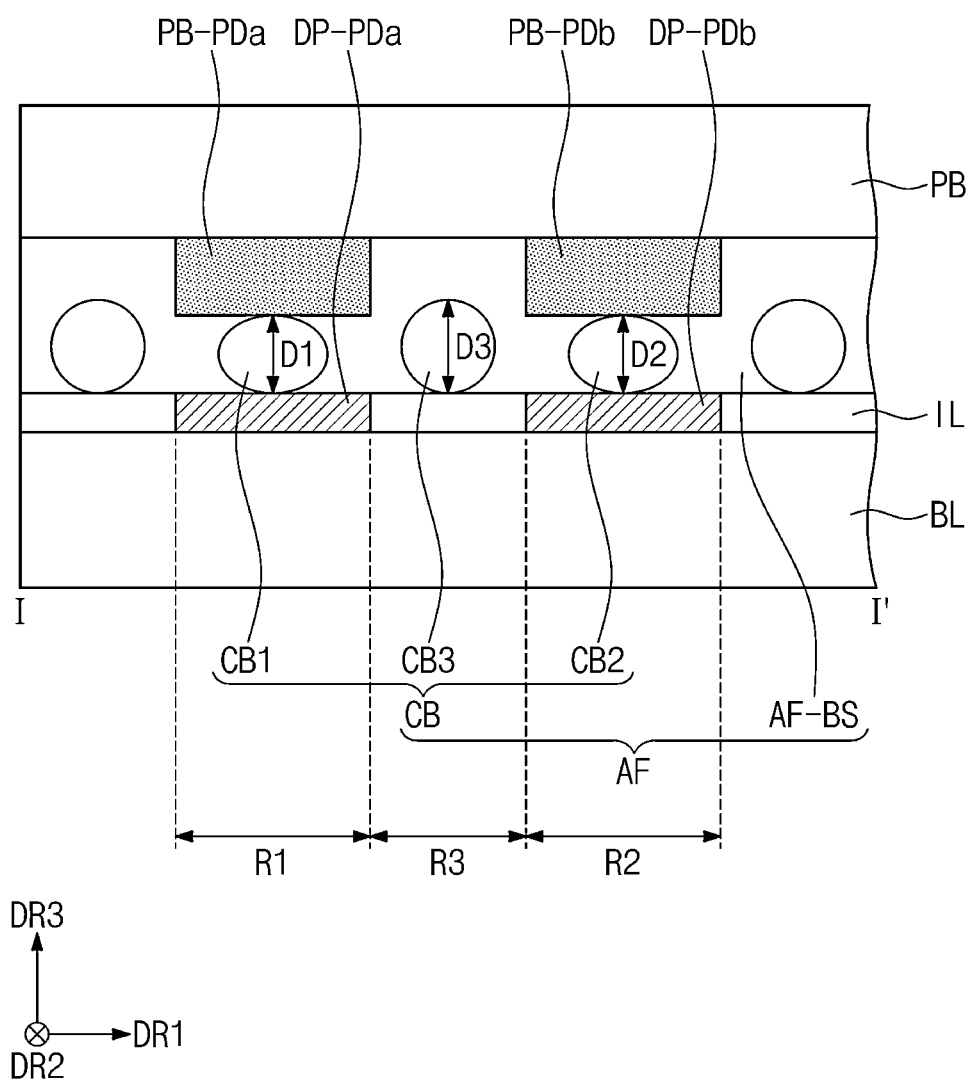
FIG. 6 is a cross-sectional view taken along a line I-I' of FIG. 5.

FIG. 5 is an exploded perspective view illustrating the display device DD according to an embodiment of the inventive concept. FIG. 6 is a cross-sectional view taken along line I-I' of FIG. 5.

FIG. 5 illustrates an enlarged shape of a portion of the display panel DP, in which the base layer BL (e.g., see FIG. 2) and a pad portion PDD (e.g., see FIG. 3) are provided. The display device DD may include an adhesive film AF, which is disposed between the display panel DP and the circuit board PB. The adhesive film AF may be in contact with each of the display panel DP and the circuit board PB.

In an embodiment, the adhesive film AF may be a conductive adhesion resin. Concretely, the adhesive film AF may be an anisotropic conductive film (ACF). The adhesive film AF may adhere the circuit board PB to the pad portion PDD of the display panel DP. Concretely, the adhesive film AF may electrically connect the signal pads DP-PD of the pad portion PDD to driving pads PB-PD of the circuit board PB. Electrical signals, which are transmitted from the circuit board PB, may be provided to the pad portion PDD through the adhesive film AF.

The line I-I' of FIG. 5 is a cutting line depicting a region, in which the driving pads PB-PD and the signal pads DP-PD are attached to each other by the adhesive film AF. FIG. 6 illustrates some of the signal pads DP-PD (e.g., a first signal pad DP-PDa and a second signal pad DP-PDb) and some of the driving pads PB-PD (e.g., a first driving pad PB-PDa and a second driving pad PB-PDb), which are placed on the line I-I' of FIG. 5.

The first signal pad DP-PDa and the second signal pad DP-PDb may be provided on the base layer BL of the display panel DP (e.g., FIG. 2) and may be disposed in contact holes defined in an insulating layer IL. The insulating layer IL may be one of the insulating layers described with reference to the circuit device layer DP-CL (e.g., see FIG. 2). However, the inventive concept is not limited to this example, and in another embodiment, the insulating layer IL may be omitted. In certain embodiments, elements included in the circuit device layer DP-CL may be further disposed between the base layer BL and the insulating layer IL.

The first signal pad DP-PDa and the second signal pad DP-PDb may be spaced apart from each other in the first direction DR1 and may have the same shape.

The first driving pad PB-PDa and the second driving pad PB-PDb may have a shape protruding from a bottom surface of the circuit board PB toward the display panel DP. The first driving pad PB-PDa and the second driving pad PB-PDb may be spaced apart from each other in the first direction DR1 and may have the same shape.

When viewed in a plan view, the first signal pad DP-PDa may overlap with the first driving pad PB-PDa, and the second signal pad DP-PDb may overlap with the second driving pad PB-PDb.

The adhesive film AF may be disposed between the circuit board PB and the display panel DP. The adhesive film AF may include a plurality of conductive balls CB and a base resin AF-BS. The conductive balls CB may include a plurality of conductive balls CB1, CB2, and CB3, which are disposed in the base resin AF-BS and are spaced apart from each other in the first direction DR1. In an embodiment, the plurality of conductive balls CB1, CB2, and CB3 may be disposed to form a single layer.

Each of the conductive balls CB1, CB2, and CB3 may be a conductive structure formed by coating a spherical polymer with a metal layer (e.g., nickel, cobalt, gold, silver, copper). The conductive balls CB1, CB2, and CB3 may be formed of or include at least one of inorganic materials (e.g., metal, metal oxide, or metal nitride).

The base resin AF-BS may include a first region R1 which overlaps with the first signal pad DP-PDa and the first driving pad PB-PDa, a second region R2 which overlaps with the second signal pad DP-PDb and the second driving pad PB-PDb, and a third region R3 which is defined between the first region R1 and the second region R2, when viewed in a plan view. The signal pad DP-PD or the driving pad PB-PD may not be disposed in the third region R3.

The conductive balls CB1, CB2, and CB3 may include a first conductive ball CB1, a second conductive ball CB2, and a third conductive ball CB3, which are disposed in the first region R1, the second region R2, and the third region R3, respectively.

The first conductive ball CB1 may be in contact with the first signal pad DP-PDa and the first driving pad PB-PDa. The first conductive ball CB1 may be fixed by a top surface of the first signal pad DP-PDa and a bottom surface of the first driving pad PB-PDa. A first diameter D1, which is a diameter of the first conductive ball CB1 in the third direction DR3, may be substantially equal to a distance in the third direction DR3 between the first signal pad DP-PDa and the first driving pad PB-PDa. The first signal pad DP-PDa may be electrically connected to the first driving pad PB-PDa through the first conductive ball CB1. In the present specification, a term "diameter" may mean a diameter of a spherical or circular object or a length of a short axis of an ellipsoidal object. In addition, a term "radius" may mean half of the diameter of the spherical, circular, or ellipsoidal object.

For example, the first diameter D1 of the first conductive ball CB1 may be a length of the first conductive ball CB1 in the third direction DR3.

The second conductive ball CB2 may be in contact with the second signal pad DP-PDb and the second driving pad PB-PDb. The second conductive ball CB2 may be fixed by a top surface of the second signal pad DP-PDb and a bottom surface of the second driving pad PB-PDb. A second diameter D2, which is a diameter of the second conductive ball CB2 in the third direction DR3, may be substantially equal to a distance in the third direction DR3 between the second signal pad DP-PDb and the second driving pad PB-PDb. The second signal pad DP-PDb may be electrically connected to the second driving pad PB-PDb through the second conductive ball CB2.

The third conductive ball CB3 may be disposed between the insulating layer IL and the bottom surface of the circuit board PB. The base resin AF-BS may be disposed between the first driving pad PB-PDa and the second driving pad PB-PDb. The third conductive ball CB3 may not overlap with the first driving pad PB-PDa and the second driving pad PB-PDb, when viewed in a plan view.

Considering that, during a fabrication process, the adhesive film AF is compressed between the display panel DP and the circuit board PB and then is cured, the conductive balls CB1, CB2, and CB3 may be slightly fluidized along the base resin AF-BS, when the adhesive film AF is compressed, but such a small fluidic property may be neglected. Concretely, if, when viewed in a plan view, a center of the third conductive ball CB3, which has a third diameter D3 in the third direction DR3, does not overlap with the first driving pad PB-PDa or the second driving pad PB-PDb, it should be understood that the third conductive ball CB3 does not overlap with the first driving pad PB-PDa or the second driving pad PB-PDb when viewed in a plan view.

In an embodiment, the first to third conductive balls CB1, CB2, and CB3 may have the same volume, and each of the first and second diameters D1 and D2 may be smaller than the third diameter D3.

To improve the reliability of the adhesive film AF, the display device DD according to an embodiment of the inventive concept may be configured to satisfy the following formula 1. In the display device DD satisfying the formula 1, a space between the first driving pad PB-PDa and the second driving pad PB-PDb may be filled with the base resin AF-BS, and in this case, it may be possible to increase an adhesion strength between the adhesive film AF and the circuit board PB and to omit an additional gap-filling process, and this may make it possible to reduce a process time and a process cost.

$$T \geq G + \frac{B \times S}{W + S}.$$ [Formula 1]

The parameters in Formula 1 will be explained later. Hereinafter, an adhesive film according to an embodiment of the inventive concept will be described in more detail with reference to the above formula 1 and FIGS. 7A, 7B, 8A, and 8B.

Figure 7A:
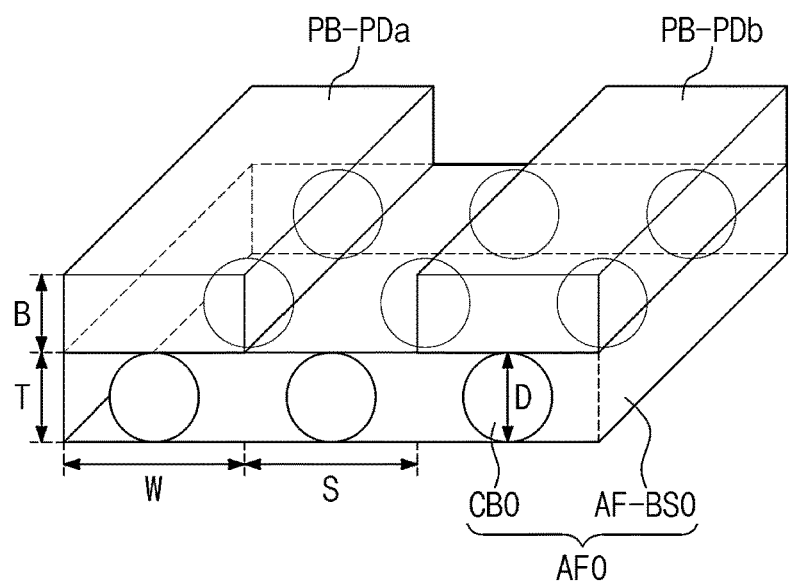
FIG. 7A is a perspective view illustrating an adhesive film according to an embodiment of the inventive concept.
Figure 7B:
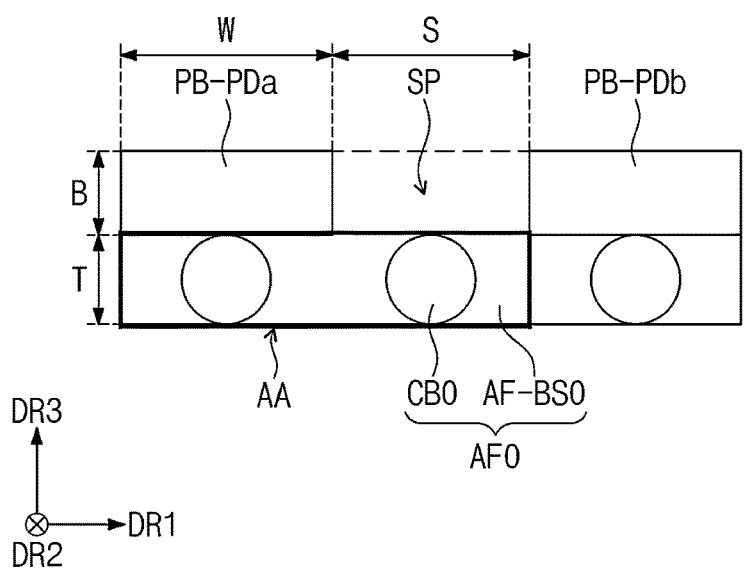
FIG. 7B is a cross-sectional view illustrating an adhesive film according to an embodiment of the inventive concept.
Figure 8A:
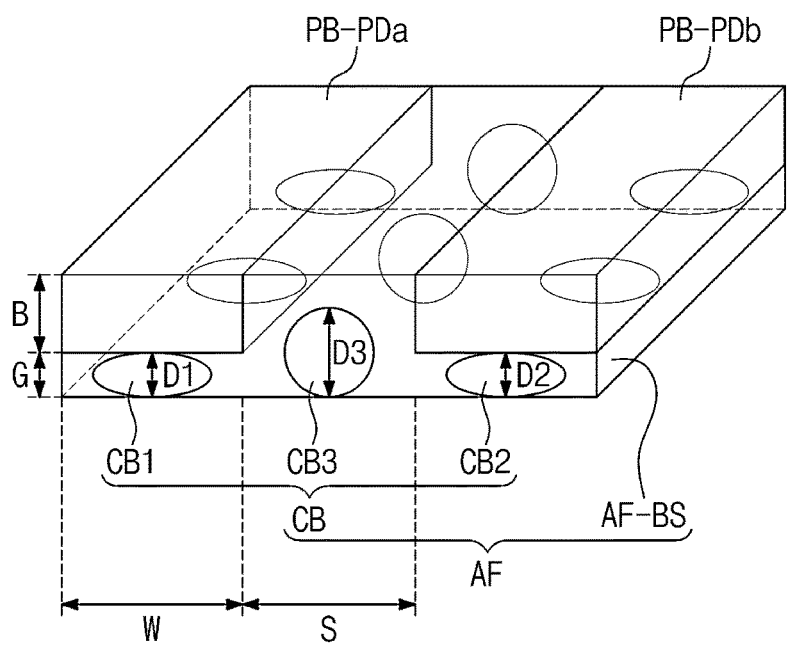
FIG. 8A is a perspective view illustrating an adhesive film according to an embodiment of the inventive concept.
Figure 8B:
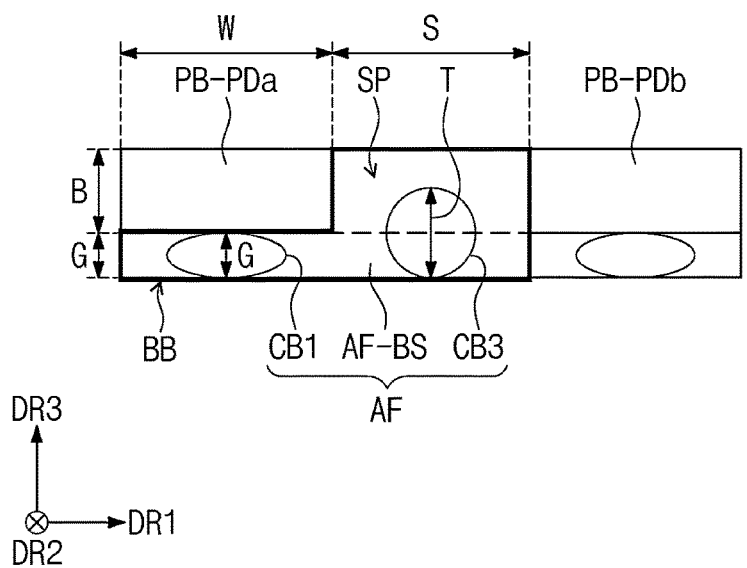
FIG. 8B is a cross-sectional view illustrating an adhesive film according to an embodiment of the inventive concept.

FIG. 7A is a perspective view illustrating an adhesive film AF0 in a pre-bonding state, according to an embodiment of the inventive concept. FIG. 7B is a cross-sectional view illustrating the adhesive film AF0 in the pre-bonding state, according to an embodiment of the inventive concept. FIG. 8A is a perspective view illustrating the adhesive film AF in a post-bonding state, according to an embodiment of the inventive concept. FIG. 8B is a cross-sectional view illustrating the adhesive film AF in the post-bonding state, according to an embodiment of the inventive concept.

FIGS. 7A and 7B illustrates an adhesive film AF0 (hereinafter, an initial adhesive film) which is disposed between the display panel DP and the circuit board PB in a pre-compression state, and the first and second driving pads PB-PDa and PB-PDb which are disposed on the initial adhesive film AF0.

Referring to FIG. 7A, a thickness of the initial adhesive film AF0 in the pre-compression state may be indicated by the reference character T. Each of the driving pads PB-PDa and PB-PDb may have a thickness which is indicated by the reference character B, and a width which is indicated by the reference character W. A distance between the driving pads PB-PDa and PB-PDb may be indicated by the reference character S. The initial adhesive film AF0 may include an initial conductive ball CB0 and an initial base resin AF-BS0. A diameter D of the initial conductive ball CB0 in the third direction DR3 may be 0.5 to 1.0 times the thickness T of the initial adhesive film AF0. An example, in which the diameter D of the initial conductive ball CB0 is one times the thickness T of the initial adhesive film AF0, is illustrated in FIG. 7A.

Referring to FIG. 7B, each of repeated unit regions in the first direction DR1 in the initial adhesive film AF0 may be defined as a region AA.

FIGS. 8A and 8B illustrate the adhesive film AF, which is disposed between the display panel DP and the circuit board PB and is compressed and cured, and may be the same as the adhesive film AF shown in FIGS. 5 and 6.

Referring to FIG. 8A, a thickness of the adhesive film AF in a region overlapped with the first driving pad PB-PDa may be indicated by the reference character G. The thickness G of the adhesive film AF in the region overlapped with the first driving pad PB-PDa may be substantially equal to the distance between the display panel DP and the first driving pad PB-PDa. Thus, in FIGS. 8A and 8B, the distance between the display panel DP and the first driving pad PB-PDa may be indicated by the reference character G. The adhesive film AF may include the first conductive ball CB1, the second conductive ball CB2, the third conductive ball CB3, and the base resin AF-BS bonded thereto. A diameter of at least one conductive ball of the first to third conductive balls CB1, CB2, and CB3 may be substantially equal to the distance G between the display panel DP and the first driving pad PB-PDa. For example, the diameter D1 of the first conductive ball CB1 and the diameter D2 of the second conductive ball CB2 may be substantially equal to the distance G between the display panel DP and the first driving pad PB-PDa.

In addition, a diameter of at least one conductive ball of the first to third conductive balls CB1, CB2, and CB3 may be substantially equal to the diameter D of the initial conductive ball CB0. For example, the diameter D3 of the third conductive ball CB3 in the third direction DR3 may be substantially equal to the diameter D of the initial conductive ball CB0 in the third direction DR3 (e.g., see FIGS. 7A and 7B).

Referring to FIG. 8B, each of repeated unit regions in the first direction DR1 in the adhesive film AF may be defined as a region BB. Except for this, the dimensions B, W, and S shown in FIGS. 8A and 8B may be substantially the same as those described with reference to FIGS. 7A and 7B.

Referring back to FIG. 7B, the first driving pad PB-PDa and the second driving pad PB-PDb may be portions protruding from the circuit board PB (e.g., see FIG. 6), and a space between the first driving pad PB-PDa and the second driving pad PB-PDb may be defined as an internal space SP. The internal space SP may be filled with the air.

The region AA may be a region of the initial adhesive film AF0 overlapped with the first driving pad PB-PDa and the internal space SP in a plan view. Only the first and second driving pads PB-PDa and PB-PDb are illustrated in FIG. 7B, but the inventive concept is not limited to this example. For example, three or more driving pads may be provided, and the initial adhesive film AF0 may have a structure, in which the regions AA are repeatedly provided.

In a process of bonding the display panel DP with the circuit board PB, the initial adhesive film AF0 of the region AA may be compressed, and as a result, the adhesive film AF of the region BB may be provided.

Referring to the region BB of FIG. 8B, in the case where the display panel DP and the circuit board PB are bonded to each other using the adhesive film AF according to an embodiment of the inventive concept, the internal space SP may be filled with the adhesive film AF. Thus, it may be unnecessary to perform an additional under-fill process for filling the internal space SP, after the bonding of the adhesive film AF.

To fill the internal space SP with the adhesive film AF, the region AA may have a volume that is equal to or larger than a volume of the region BB.

If, the volume of the initial base resin AF-BS0 of the region AA is greater than the volume of the base resin AF-BS of the region BB and, during the process of compressing the adhesive film AF, the volume of the initial conductive ball CB0 and the volume of the conductive ball CB are maintained to the same values, it may be possible to omit an additional under-fill process, after attaching the circuit board PB to the display panel DP.

If the variables V1 and V2 are used to represent the volume of the base resin AF-BS0 of the region AA and the volume of the base resin AF-BS of the region BB, respectively, the variables V1 and V2 may be given by the following equations. The width of the base resin AF-BS0 in the second direction DR2, which is not shown in the cross-sectional views of FIGS. 8A and 8B but is needed to calculate the volumes of the regions AA and BB, is given as a variable H.

$$V1 = (W+S) \times T \times H - n \times (4/3) \times \pi \times (r)3,$$

$$V2 = (W \times G + (B+G) \times S) \times H - n \times (4/3) \times \pi \times (r)3, \text{ and}$$

where n is the number of the conductive balls CB0 and CB in the region AA or BB, and r is a radius of the conductive balls CB0 and CB.

The volume of the base resin AF-BS0 of the region AA should be equal to or larger than the volume of the base resin AF-BS of the region BB (i.e., V1≥V2), and thus, substituting the variables V1 and V2 into the inequality V1≥V2 gives the following formula 1.

$$T \geq G + \frac{B \times S}{W + S}. \quad \text{[Formula 1]}$$

Referring to the formula 1, the thickness T of the initial adhesive film AF0 may be set in consideration of the thickness G of the adhesive film AF in the post-bonding state, a thickness B of the first driving pad PB-PDa, a width W of the first driving pad PB-PDa, and a distance S between the first driving pad PB-PDa and the second driving pad PB-PDb. For the adhesive film AF satisfying the formula 1, an additional under-fill process to fill the internal space SP may not be needed, after the process of bonding the display panel DP and the circuit board PB.

Furthermore, to allow the adhesive film AF to have a conductive property, the diameter D of the initial conductive ball CB0 may increase in proportion to the thickness T of the initial adhesive film AF0. Concretely, the diameter D of the initial conductive ball CB0 may be 0.5 to 1.0 times the thickness T of the initial adhesive film AF0.

For example, in the display device DD satisfying the formula 1, the thickness T of the adhesive film AF0 may have values shown in the following table 1, according to the thickness B of the driving pads PB-PDa and PB-PDb and the distance G between the display panel DP and the driving pad PB-PD in the post-bonding state. The values in Table 1 may be in units of micrometers, and the diameter D of the conductive ball CB0 in Table 1 is set to be equal to the thickness T of the adhesive film AF0.

[Thickness of Adhesive Film T in Pre-Compression State]

TABLE 1

| Item | Thickness of driving pad (B) | | | | | | |
|---|---|---|---|---|---|---|---|
| | 2 | 3 | 4 | 5 | 6 | 7 | 8 |
| Distance between display panel and driving pad (G) | 2 | 3 | 3.5 | 4 | 4.5 | 5 | 5.5 | 6 |
| | 2.5 | 3.5 | 4 | 4.5 | 5 | 5.5 | 6 | 6.5 |
| | 3 | 4 | 4.5 | 5 | 5.5 | 6 | 6.5 | 7 |
| | 3.5 | 4.5 | 5 | 5.5 | 6 | 6.5 | 7 | 7.5 |
| | 4 | 5 | 5.5 | 6 | 6.5 | 7 | 7.5 | 8 |
| | 5 | 6 | 6.5 | 7 | 7.5 | 8 | 8.5 | 9 |
| | 6 | 7 | 7.5 | 8 | 8.5 | 9 | 9.5 | 10 |
| | 7 | 8 | 8.5 | 9 | 9.5 | 10 | 10.5 | 11 |

For example, referring to Table 1, the thickness T of the initial adhesive film AF0 may be 7 micrometers (μm) so as to adjust the thickness B of the driving pads PB-PDa and PB-PDb to 4 μm and to adjust the distance G between the display panel DP and the driving pad PB-PD to 5 μm. Here, the diameter D of the initial conductive ball CB0 is assumed to be equal to the thickness T of the adhesive film AF0.

Thus, the reliability of the adhesive film AF may be improved by selecting the thickness T of the initial adhesive film AF0 in consideration of the thickness B of the driving pads PB-PDa and PB-PDb and the thickness G of the final adhesive film AF, as shown in Table 1.

Table 2 shows a change (percentages: %) of a diameter of the conductive ball of the display device DD written in Table 1. The change (%) of the diameter of the conductive ball is defined as (the diameter of the conductive ball CB0 in the pre-compression state−the diameter of the conductive ball CB in the post-compression state)/(the diameter of the conductive ball CB0 in the pre-compression state)×100(%).

[Change of Diameter of Conductive Ball]

TABLE 2

|  |  | Thickness of driving pad (B) | | | | | | |
|---|---|---|---|---|---|---|---|---|
| Item | | 2 | 3 | 4 | 5 | 6 | 7 | 8 |
| Distance between display panel and driving pad (G) | 2 | 33 | 43 | 50 | 56 | 60 | 64 | 67 |
| | 2.5 | 29 | 38 | 44 | 50 | 55 | 58 | 62 |
| | 3 | 25 | 33 | 40 | 45 | 50 | 54 | 57 |
| | 3.5 | 22 | 30 | 36 | 42 | 46 | 50 | 53 |
| | 4 | 20 | 27 | 33 | 38 | 43 | 47 | 50 |
| | 5 | 17 | 23 | 29 | 33 | 38 | 41 | 44 |
| | 6 | 14 | 20 | 25 | 29 | 33 | 37 | 40 |
| | 7 | 13 | 18 | 22 | 26 | 30 | 33 | 36 |

In Table 2, the diameter D of the initial conductive ball CB0 in the pre-compression state was calculated to be equal to the initial adhesive film AF0 thickness T, and the diameter of the conductive ball CB in the post-compression state was calculated to be equal to the distance G between the display panel DP and the driving pad PB-PD. For example, in the case where the thickness B of the driving pads PB-PDa and PB-PDb is 4 μm and the distance G between the display panel DP and the driving pad PB-PD is 5 μm, the initial adhesive film AF0 thickness is 7 μm as shown in Table 1. Thus, the diameter of the conductive ball CB0 in the pre-compression state may be 7 μm, and the diameter of the conductive ball CB in the post-compression state may be 5 μm.

Here, the change of the diameter of the conductive ball is calculated as (7−5)/7=2/7 (about 29%).

However, in the case where the change of the diameter of the conductive ball is greater than or equal to about 25%, the conductive ball may be fluidized due to an elastic force of the conductive ball, and this may lead to a reduction in reliability of the adhesive film AF.

Thus, the display device DD according to an embodiment of the inventive concept may satisfy the formula 1, and the change of the diameter of the conductive ball may be lower than or equal to about 25%.

Tables 1 and 2 show the case in which the diameter of the initial conductive ball CB0 is adjusted to be equal to the thickness T of the adhesive film AF0. However, if the initial conductive ball CB0 diameter is smaller than the thickness T of the adhesive film AF0, the number of the embodiments, which satisfies the formula 1 and in which the change of the diameter of the conductive ball is less than or equal to about 25%, may increase.

For example, the following table 3 shows the change (%) of the diameter of the conductive ball in the display device DD in which the diameter of the initial conductive ball CB0 is 0.8 times the thickness T of the initial adhesive film AF0.

TABLE 3

|  |  | Thickness of driving pad (B) | | | | | | |
|---|---|---|---|---|---|---|---|---|
| Item | | 2 | 3 | 4 | 5 | 6 | 7 | 8 |
| Distance between display panel and driving pad (G) | 2 | 17 | 29 | 38 | 44 | 50 | 55 | 58 |
| | 2.5 | 11 | 22 | 31 | 38 | 43 | 48 | 52 |
| | 3 | 6 | 17 | 25 | 32 | 38 | 42 | 46 |
| | 3.5 | 3 | 13 | 20 | 27 | 33 | 38 | 42 |
| | 4 | 0 | 9 | 17 | 23 | 29 | 33 | 38 |
| | 5 | −4 | 4 | 11 | 17 | 22 | 26 | 31 |
| | 6 | −7 | 0 | 6 | 12 | 17 | 21 | 25 |
| | 7 | −9 | −3 | 3 | 8 | 13 | 17 | 20 |

Comparing Tables 2 and 3, the number of the embodiments, in which the change (%) of the diameter of the conductive ball is less than or equal to 25%, increases from 11 to 32.

Thus, in the display device DD according to an embodiment of the inventive concept, it may be possible to choose a thickness T of the initial adhesive film AF0 capable of satisfying the formula 1, in consideration of the thickness B of the driving pads PB-PDa and PB-PDb, the thickness G of the final adhesive film AF, and the diameter D of the initial conductive ball CB0.

Figure 9A:
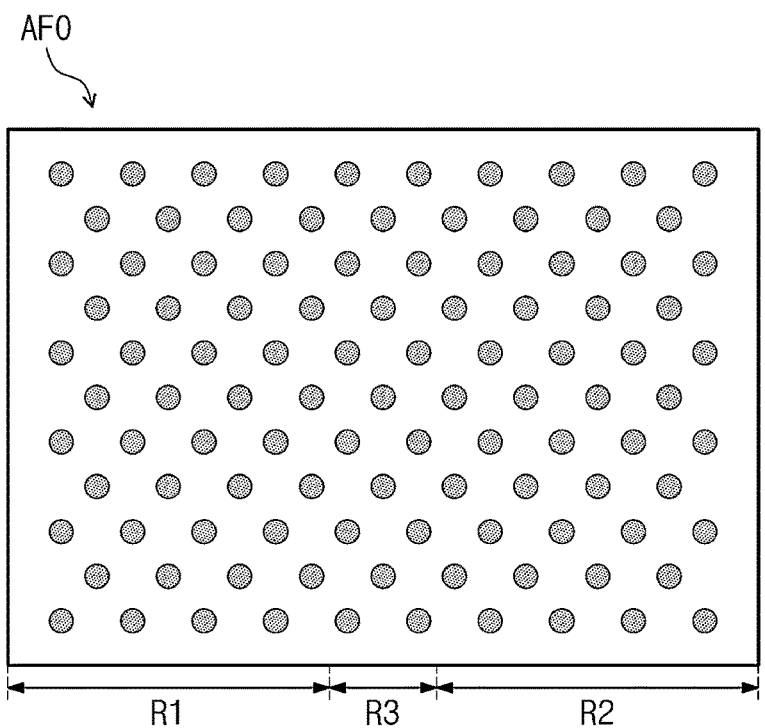
FIG. 9A is a plan view illustrating an adhesive film according to an embodiment of the inventive concept.
Figure 9B:
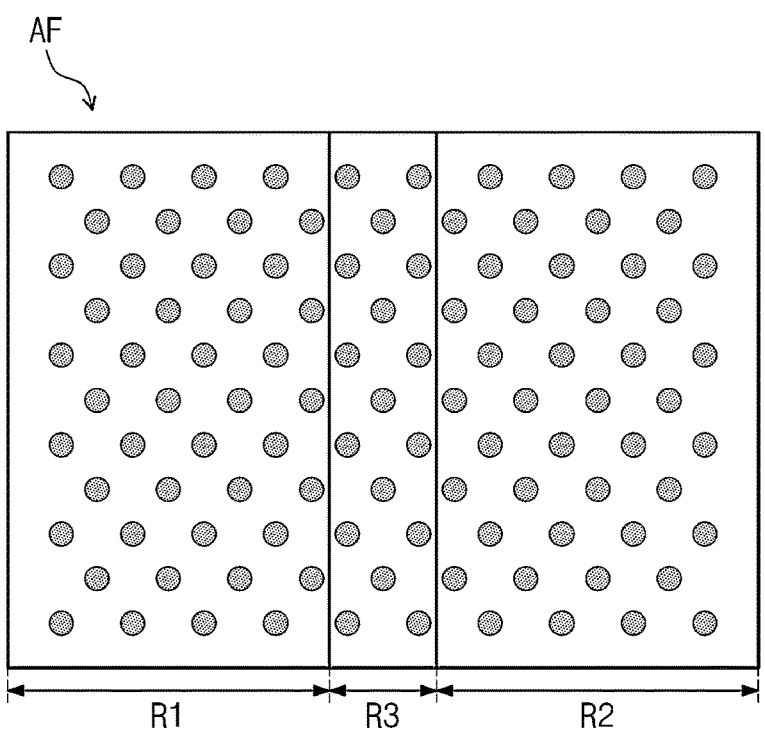
FIG. 9B is a plan view illustrating an adhesive film according to an embodiment of the inventive concept.

FIG. 9A is a plan view illustrating the adhesive film AF according to an embodiment of the inventive concept. FIG. 9B is a plan view illustrating the adhesive film AF according to an embodiment of the inventive concept.

FIG. 9A illustrates the adhesive film AF0, which is disposed between the display panel DP and the circuit board PB in the pre-compression state.

Referring to FIGS. 6 and 9A, the density of the conductive balls disposed in the first to third regions R1, R2, and R3 may be all the same.

FIG. 9B illustrates the adhesive film AF, which is disposed between the display panel DP and the circuit board PB in the post-compression state. As described above, for the display device DD, which satisfies the formula 1 and in which a change in the diameter of the conductive ball is less than or equal to about 25%, the density of the conductive balls disposed in the first to third regions R1, R2, and R3 may be unchanged, even after the compression, as shown in FIG. 9B.

In an embodiment, for the display device DD satisfying the formula 1, it may be possible to control the fluidity of the conductive balls in the process of compressing and curing the adhesive film AF and to improve the adhesion strength between the display panel DP and the circuit board PB, and thus, the reliability of the display device DD may be improved.

According to an embodiment of the inventive concept, it may be possible to improve reliability of a display device.

While example embodiments of the inventive concept have been particularly shown and described, it will be understood by one of ordinary skill in the art that variations in form and detail may be made therein without departing from the spirit and scope of the attached claims.

What is claimed is:

1. A display device, comprising:
   a display panel including a display region and a non-display region and including a first signal pad, an insulating layer and a second signal pad, wherein the first signal pad, the insulating layer, and the second signal pad are arranged in a first direction in the non-display region;
   a circuit board disposed on the display panel and overlapped with the first and second signal pads in a thickness direction; and
   an adhesive film disposed between the circuit board and the display panel and overlapped with the first and second signal pads,
   wherein the adhesive film comprises a base resin and a plurality of conductive balls dispersed in the base resin,
   the circuit board comprises a first driving pad and a second driving pad, the first and second driving pads protruding toward the adhesive film and arranged in the first direction,
   the first driving pad and the second driving pad overlap with the first signal pad and the second signal pad, respectively, the adhesive film comprises a first region overlapped with the first driving pad, a second region overlapped with the second driving pad, and a third region defined as a region between the first region and the second region,
a height of a bottom surface of the first region and a height of a bottom surface of the third region in the thickness direction are the same,
the plurality of conductive balls comprises a first conductive ball disposed in the first region, a second conductive ball disposed in the second region, and a third conductive ball disposed in the third region,
a diameter of the third conductive ball in the thickness direction is substantially a same as a thickness of the adhesive film T,
the display device satisfies a following formula 1:

$$T \geq G + \frac{B \times S}{W + S}, \quad \text{[Formula 1]}$$

where B is a thickness of the first driving pad in the thickness direction,
T is the thickness of the adhesive film before bonding the circuit board to the display panel,
G is a distance between the first signal pad and the first driving pad,
S is a distance between the first driving pad and the second driving pad, and
W is a width of the first driving pad in the first direction, and
G is greater than B.

2. The display device of claim 1, wherein the base resin is disposed between the first driving pad and the second driving pad.

3. The display device of claim 1, wherein the first to third conductive balls have a same volume.

4. The display device of claim 3, wherein the display panel is parallel to a plane defined by the first direction and a second direction crossing the first direction,
each of lengths of the first and second conductive balls in a third direction perpendicular to the plane is equal to the distance G, and
the third direction is the thickness direction.

5. The display device of claim 3, wherein a diameter of the third conductive ball in the thickness direction is greater than the distance G.

6. The display device of claim 3, wherein the thickness B is smaller than a diameter of the third conductive ball in the thickness direction.

7. The display device of claim 3, wherein the first conductive ball is in direct contact with both of the first signal pad and the first driving pad, and
the second conductive ball is in direct contact with both of the second signal pad and the second driving pad.

8. The display device of claim 3, wherein a change in diameter of the plurality of conductive balls is defined as (a diameter of the third conductive ball in the thickness direction−a diameter of the first conductive ball in the thickness direction)/the diameter of the third conductive ball×100 (percentages: %), and
the change in diameter of the plurality of conductive balls is less than or equal to about 25%.

9. The display device of claim 1, wherein the plurality of conductive balls is arranged in the first direction.

10. The display device of claim 1, wherein the display panel includes a first pixel and a second pixel, which overlap with the display region, and
each of the first and second signal pads transmits an electrical signal to each of the first and second pixels.

11. The display device of claim 1, wherein the circuit board is a driving chip.

12. The display device of claim 1, wherein the circuit board is a flexible circuit board.

13. The display device of claim 1, wherein the first signal pad and the second signal pad have a same shape, and
the first driving pad and the second driving pad have a same shape.

14. The display device of claim 1, wherein the base resin comprises a heat-curing resin or a photo-curing resin.

15. The display device of claim 1, wherein the plurality of conductive balls comprises at least one of metals, metal oxides, or metal nitrides.

16. The display device of claim 1, wherein the plurality of conductive balls is arranged to form a single layer.

17. A display device, comprising:
a display panel including a display region and a non-display region and including a first signal pad, an insulating layer, and a second signal pad, wherein the first signal pad, the insulating layer, and the second signal pad are arranged in a first direction in the non-display region;
a circuit board disposed on the display panel and overlapped with the first and second signal pads in a thickness direction; and
an adhesive film disposed between the circuit board and the display panel and overlapped with the first and second signal pads,
wherein the adhesive film comprises a base resin and a plurality of conductive balls dispersed in the base resin,
the circuit board comprises a first driving pad and a second driving pad, the first and second driving pads protruding toward the adhesive film and arranged in the first direction,
the first driving pad and the second driving pad overlap with the first signal pad and the second signal pad, respectively,
the adhesive film comprises:
a first region overlapped with the first driving pad;
a second region overlapped with the second driving pad; and
a third region defined between the first region and the second region,
a height of a bottom surface of the first region and a height of a bottom surface of the third region in the thickness direction are the same,
the base resin is disposed between the first driving pad and the second driving pad,
a diameter of the conductive balls disposed in the third region is substantially a same as a thickness of the adhesive film before bonding the circuit board to the display panel, and
a distance between the first signal pad and the first driving pad is greater than a thickness of the first driving pad in the thickness direction.

18. The display device of claim 17, wherein the plurality of conductive balls is arranged to form a single layer.

19. The display device of claim 17, wherein each of the plurality of conductive balls disposed in the first region is in direct contact with each of the first signal pad and the first driving pad.

* * * * *